United States Patent
Liao

(10) Patent No.: US 7,556,506 B2
(45) Date of Patent: Jul. 7, 2009

(54) ELECTRICAL CONTACTS AND ELECTRICAL CONNECTOR ASSEMBLY HAVING SUCH ELECTRICAL CONTACTS

(75) Inventor: Fang-Jun Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/901,329

(22) Filed: Sep. 17, 2007

(65) Prior Publication Data

US 2008/0070425 A1    Mar. 20, 2008

(30) Foreign Application Priority Data

Sep. 15, 2006   (CN)   ................ 2006 1 0096096

(51) Int. Cl.
*H01R 12/00* (2006.01)
(52) U.S. Cl. ........................................ 439/71
(58) Field of Classification Search ............ 439/71, 439/73, 66, 83, 246–248
See application file for complete search history.

(56) References Cited

U.S. PATENT DOCUMENTS

| | | | |
|---|---|---|---|
| 6,203,331 B1 * | 3/2001 | McHugh et al. | 439/71 |
| 6,210,176 B1 * | 4/2001 | Hsiao | 439/71 |
| 7,059,873 B2 * | 6/2006 | Johnescu et al. | 439/83 |
| 7,083,429 B2 * | 8/2006 | Hashimoto et al. | 439/71 |
| 7,261,568 B2 * | 8/2007 | Ju et al. | 439/66 |
| 2005/0054218 A1 * | 3/2005 | Liao et al. | 439/66 |

* cited by examiner

*Primary Examiner*—Jean F Duverne
(74) *Attorney, Agent, or Firm*—Wei Te Chung

(57) ABSTRACT

An electrical connector assembly (5) includes an insulative housing, a number of electrical contacts (7) retained in the insulative housing, a chip module disposed above the insulative housing and comprising a number of connecting elements (80) to electrically connect the electrical contacts, and a printed circuit board (6) disposed below the insulative housing and comprising a number of conductive elements (60) to electrically connect the electrical contacts. The central axis of each connecting element of the chip module is aligned with the central axis of the conductive element of the printed circuit board in up-to-down direction.

8 Claims, 2 Drawing Sheets

ELECTRICAL CONTACTS AND ELECTRICAL CONNECTOR ASSEMBLY HAVING SUCH ELECTRICAL CONTACTS

BACKGROUND OF THE INVENTION

1. Field of the Invention

The present invention generally relates to electrical contacts and an electrical connector assembly having such electrical contacts, and more particularly to electrical contacts and an electrical connector assembly having such electrical contacts for removably mounting a chip module to a printed circuit board.

2. Description of Related Art

Please refer to FIG. 1, a conventional electrical connector assembly 1 usually comprises an electrical connector (not shown), and a chip module and a printed circuit board 2 respectively connecting to top and bottom ends of the electrical connector. The electrical connector comprises an insulative housing (not shown) and a plurality of electrical contacts 3 retained in the insulative housing. The chip module has a plurality of pins 40 at bottom end thereof, while the printed circuit board 2 is arranged with a plurality of solder pads 20 on top surface thereof. The pins and the solders pads 20 respectively contact top and bottom ends of the electrical contacts 3 to form electrical connection between the chip module and the printed circuit board 2.

However, after the pins of the chip module is inserted into the insulative housing to electrically connect with the electrical contacts 3, and the electrical contacts 3 are disposed on the conductive pads 20 of the printed circuit board 2, the central axis of the pin 40 along up-to-down direction is not aligned with the central axis of the conductive pad 20 along up-to-down direction, that is to say, there is a certain displacement between the two central axises of the pin 40 and the conductive pad 20. Further, the displacements will be different in different electrical connectors. Therefore, it is difficult and disturbed for customers to design and manufacture tools to test electrical connectors because different displacements need to design different test tools.

Therefore, it is desired to provide an improved electrical connector assembly to stress the problems mentioned above.

BRIEF SUMMARY OF THE INVENTION

Accordingly, an object of the present invention is to provide electrical contacts and an electrical connector having such electrical contacts which is helpful for customers to design and manufacture test tools.

In order to achieve the above-mentioned object, an electrical connector assembly comprises an insulative housing, a plurality of electrical contacts retained in the insulative housing, a chip module disposed above the insulative housing and comprising a plurality of connecting elements to electrically connect the electrical contacts, and a printed circuit board disposed below the insulative housing and comprising a plurality of conductive elements to electrically connect the electrical contacts. The central axis of each connecting element of the chip module is aligned with the central axis of the conductive element of the printed circuit board in up-to-down direction.

In order to achieve the above-mentioned object, an electrical contact retained in an insulative housing adapted for electrically connecting a chip module to a printed circuit board comprises a contacting portion adapted for electrically connecting with the chip module, and a mounting portion adapted for electrically connecting with the printed circuit board. The central axis of the contacting portion is aligned with the central axis of the mounting portion along up-to-down direction.

Other objects, advantages and novel features of the invention will become more apparent from the following detailed description of the present embodiment when taken in conjunction with the accompanying drawings.

DETAILED DESCRIPTION OF THE INVENTION

Figure 1:
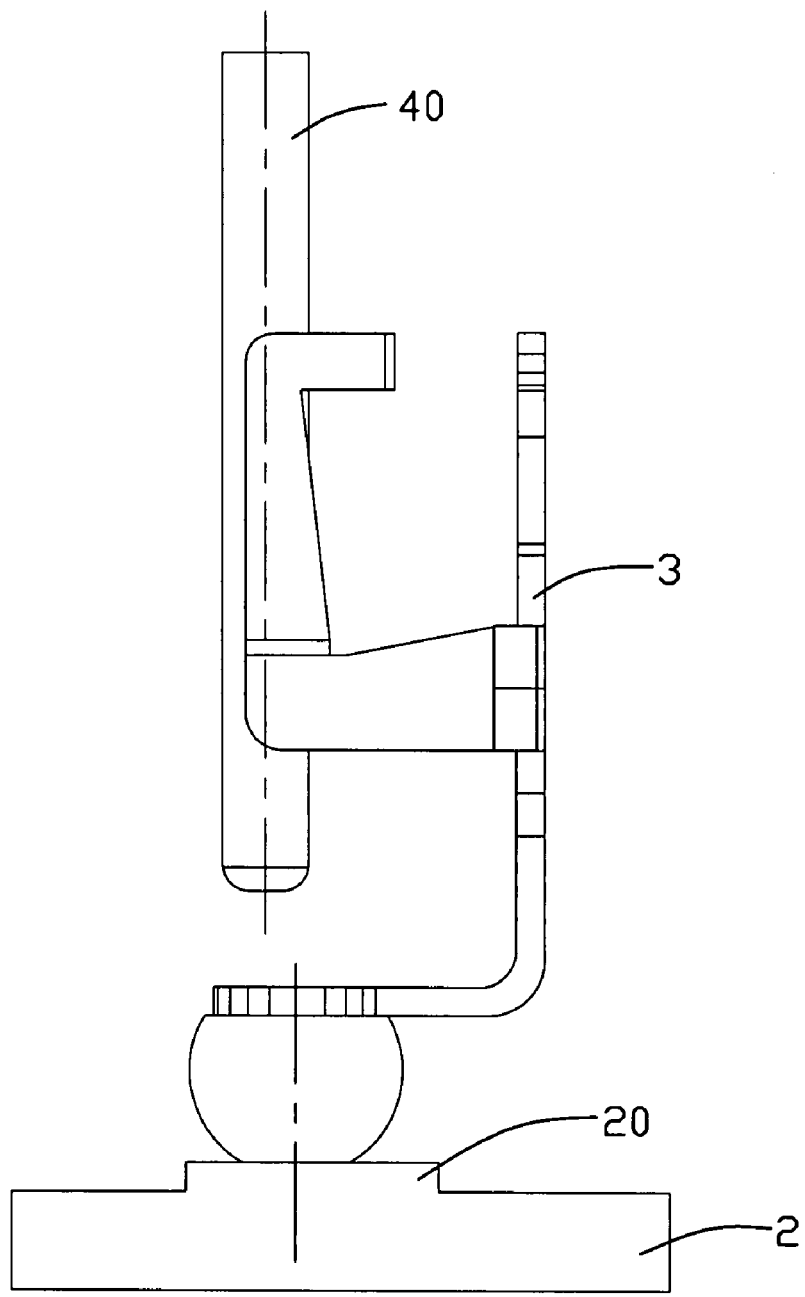
FIG. 1 is a side elevation view illustrating a conventional electrical connector assembly.

Reference will now be made to the drawing figures to describe the present invention in detail.

Figure 2:
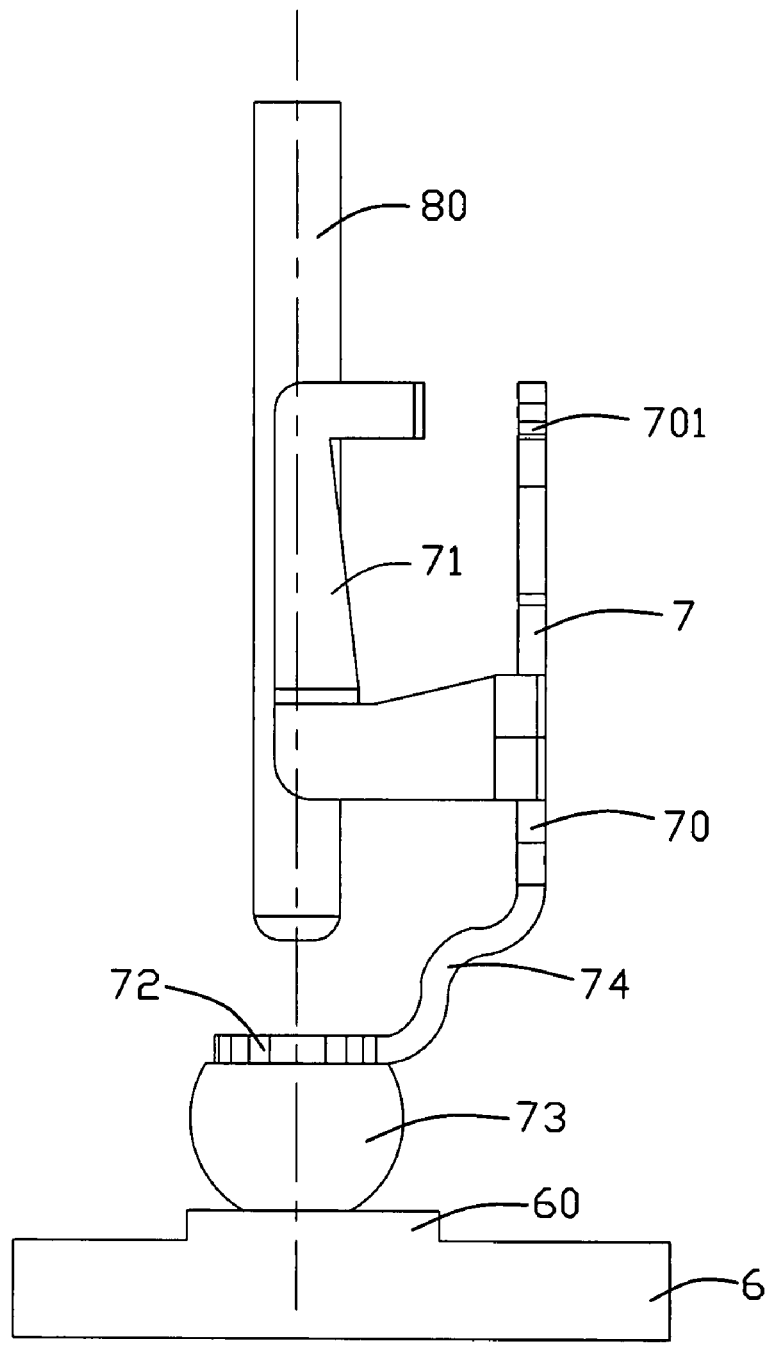
FIG. 2 is a side elevation view illustrating an electrical connector assembly in accordance with the present invention.

Please refer to FIG. 2, an electrical connector assembly 5 in accordance with the present invention comprises an electrical connector (not shown), and a chip module 8 and a printed circuit board 6 connecting to top and bottom ends of the electrical connector. The electrical connector comprises an insulative housing 9 and a plurality of electrical contacts 7 (only one is shown in FIG. 2) retained in the insulative housing 9.

The chip module 8 and the printed circuit board 6 respectively have connecting elements 80 (only one is shown in FIG. 2) and conductive elements 60 electrically connect with the electrical contacts 7. In the preferred embodiment of the present invention, connecting elements 80 are pins disposed at lower end of the chip module 8, while the conductive portions 60 are conductive pads disposed on upper surface of the printed circuit board.

The electrical contact 7 comprises a base portion 70, a contacting portion 71, a pair of contacting arms in the preferred embodiment, upwardly extending from opposite ends of the base portion 70 to electrically connect with the pins 80 of the chip module 8, and a mounting portion 72 extending from bottom end of the base portion 70. The base portion 70 is of flat board and located in a vertical plane. A plurality of barbs 701 are disposed on opposite sides thereof capable of interferentially engaging with the insulative housing 9 to retain the electrical contact 7 in the insulative housing.

The pair of contacting portions 71 respectively extend forwardly then upwardly, finally backwardly from opposite sides of the base portion 70 to form a substantially n-shape. The pair of contacting portions 71 also extend toward each other to form a certain angle to sandwich the pins 80 of the chip module 8 for realizing the electrical connection between the chip module 8 and the electrical contacts 7.

The mounting portion 72 is substantially a flat board and locates in a horizontal plane. A solder ball 73 or block-shape solder material is disposed below the mounting portion 72 to form electrical connection with the solder pads 60 of the printed circuit board 6. The central axis of the mounting portion 72 along up-to-down direction, that is the mating direction, is aligned with the central axis of the contacting portions 71 along the up-to-down mating direction. Since the mounting portion 72 and the contacting portions 71 respectively connect with the pins 80 of the chip module 8 and the solder pads 60 of the printed circuit board 6, the central axis of the pins 80 along up-to-down direction is aligned with the central axis of the solder pads 60 along the up-to-down direction. Therefore, a standard tool for testing electrical connector is capable of designed and manufactured easily.

A curved connecting portion 74 connects with bottom end of the base portion 70 and right end of the mounting portion 72. Since the curved connecting portion 74 has certain flexibility to prevent the break of the solder balls 73.

Further, it should be pointed out that the contacting portions 71 and the mounting portions 72 can be compression structure, and the mounting portions 72 also can be pin type structure to be inserted into corresponding through holes of the printed circuit board. The pins 80 also can be pads to connect with compression structure contacting portions 71 of the electrical contacts 7.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly, comprising:
   an insulative housing;
   a plurality of electrical contacts retained in the insulative housing;
   a chip module disposed above the insulative housing and comprising a plurality of connecting elements to electrically connect the electrical contacts;
   a printed circuit board disposed below the insulative housing and comprising a plurality of conductive elements to electrically connect the electrical contacts; wherein
   the central axis of each connecting element of the chip module is substantially aligned with the central axis of the conductive element of the printed circuit board in up-to-down direction; wherein
   each electrical contact comprises a base portion located in a vertical plane, a contacting portion extending from one side edge of the base portion and a mounting portion extending from bottom end of the base portion; wherein
   the base portion has a plurality of barbs on opposite side edges thereof to interferentially engage with the insulative housing.

2. The electrical connector assembly as claimed in claim 1, wherein the contacting element of the chip module is a pin inserted into the insulative housing, and wherein the electrical contact comprises a pair of contacting portions to sandwich the pin of the chip module.

3. The electrical connector assembly as claimed in claim 1, wherein the conductive elements of the printed circuit board are solder pads arranged on upper surface of the printed circuit board, and wherein the electrical contact comprises a flat mounting portion soldered to the solder pads of the printed circuit board.

4. The electrical connector assembly as claimed in claim 1, wherein the contacting element of the chip module is a pad disposed below the chip module, and wherein the electrical contact comprises a compression portion elastically contacting the pad of the chip module.

5. The electrical connector assembly as claimed in claim 1, wherein the conductive element of the printed circuit board is a through hole extending through the printed circuit board, and wherein the electrical contact comprises a pin type mounting portion inserting through the through hole of the printed circuit board.

6. The electrical connector assembly as claimed in claim 1, wherein the electrical contact comprises a flexible connecting portion connecting with the base portion and the mounting portion for increasing the flexibility of the electrical contact.

7. A combination comprising:
   an electrical contact defining a retention section, contacting section and a soldering section under a condition that the contacting section and the soldering section are both on a same side of the retention section; and
   a solder ball attached under the soldering section; wherein the contacting section defines a vertical mating axis being engaged with a corresponding pin of an electronic package, and the solder ball defines a vertical center line being correctly positioned upon a corresponding conductive pad on a printed circuit board, under a condition that the mating axis is vertical aligned with the center line so as to assure the corresponding pin aligned with the center line; wherein said contacting section includes a pair of arms to sandwich the corresponding pin therebetween.

8. The combination as claimed in claim 7, wherein the retention section essentially extends in a vertical plane, and a curved section is linked between the soldering section and the retention section.

\* \* \* \* \*